United States Patent
Kondo et al.

(10) Patent No.: US 12,052,034 B2
(45) Date of Patent: Jul. 30, 2024

(54) MEMORY SYSTEM AND METHOD OF CONTROLLING NONVOLATILE MEMORY

(71) Applicant: Kioxia Corporation, Tokyo (JP)

(72) Inventors: Yuki Kondo, Kawasaki (JP); Takahiro Kubota, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/180,481

(22) Filed: Mar. 8, 2023

(65) Prior Publication Data

US 2023/0387942 A1    Nov. 30, 2023

(30) Foreign Application Priority Data

May 26, 2022    (JP) .................................. 2022-086172

(51) Int. Cl.
*H03M 13/15*    (2006.01)
*G06F 17/11*    (2006.01)

(52) U.S. Cl.
CPC .......... *H03M 13/159* (2013.01); *G06F 17/11* (2013.01)

(58) Field of Classification Search
CPC .......... H03M 13/159; H03M 13/1515; H03M 13/152; H03M 13/1545; G06F 17/11
See application file for complete search history.

(56) References Cited

U.S. PATENT DOCUMENTS

| 4,099,160 A | 7/1978 | Flagg |
| 9,362,953 B2 | 6/2016 | Kern et al. |
| 2011/0145677 A1* | 6/2011 | Saxena ............... H03M 13/152 714/759 |
| 2018/0331700 A1* | 11/2018 | Lien ...................... H03M 13/07 |

FOREIGN PATENT DOCUMENTS

| JP | 59-165153 A | 9/1984 |
| JP | 7-231261 A | 8/1995 |
| WO | WO 01/84719 A1 | 11/2001 |

* cited by examiner

*Primary Examiner* — Thien Nguyen
(74) *Attorney, Agent, or Firm* — Oblon, McClelland, Maier & Neustadt, L.L.P.

(57) ABSTRACT

A memory system according to an embodiment includes a nonvolatile memory and a memory controller. The nonvolatile memory stores data encoded by using an error correcting code for correcting n-bit errors(n is an integer of 3 or more) or less. The memory controller reads a received word from the nonvolatile memory, calculates a syndrome by using the read received word, estimates the number of bit errors by using the syndrome. When the number of bit errors is 2 or 3, the memory controller calculates an inverse element of a value calculated based on the syndrome, executes, by using the inverse element, variable transformation on a variable of an error locator polynomial corresponding to the number of bit errors and calculation of a root of a transformed polynomial obtained by transforming the error locator polynomial according to the variable transformation, executes variable inverse transformation on the root of the transformed polynomial to obtain the root of the error locator polynomial, and corrects the error in the error location corresponding to the root of the error locator polynomial.

19 Claims, 6 Drawing Sheets

MEMORY SYSTEM AND METHOD OF CONTROLLING NONVOLATILE MEMORY

CROSS-REFERENCE TO RELATED APPLICATIONS

This application is based upon and claims the benefit of priority from Japanese Patent Application No. 2022-086172, filed on May 26, 2022; the entire contents of which are incorporated herein by reference.

FIELD

Embodiments described herein relate generally to a memory system and a control method.

BACKGROUND

In order to protect data to be stored, a memory system generally stores data encoded by using error correcting codes. Therefore, the data stored in the memory system is read as a received word and decoding is performed on the read data which has been encoded by using error correcting codes.

DETAILED DESCRIPTION

A memory system according to an embodiment includes a nonvolatile memory and a memory controller. The nonvolatile memory stores data encoded by using an error correcting code for correcting n-bit errors (n is an integer of 3 or more) or less. The memory controller reads a received word from the nonvolatile memory, calculates a syndrome by using the read received word, estimates the number of bit errors by using the syndrome. When the number of bit errors is 2 or 3, the memory controller calculates an inverse element of a value calculated based on the syndrome, executes, by using the inverse element, variable transformation on a variable of an error locator polynomial corresponding to the number of bit errors and calculation of a root of a transformed polynomial obtained by transforming the error locator polynomial according to the variable transformation, executes variable inverse transformation on the root of the transformed polynomial to obtain the root of the error locator polynomial, and corrects the error in the error location corresponding to the root of the error locator polynomial.

Hereinafter, a preferred embodiment of the memory system according to the present invention will be described in detail with reference to the accompanying drawings.

Figure 1:
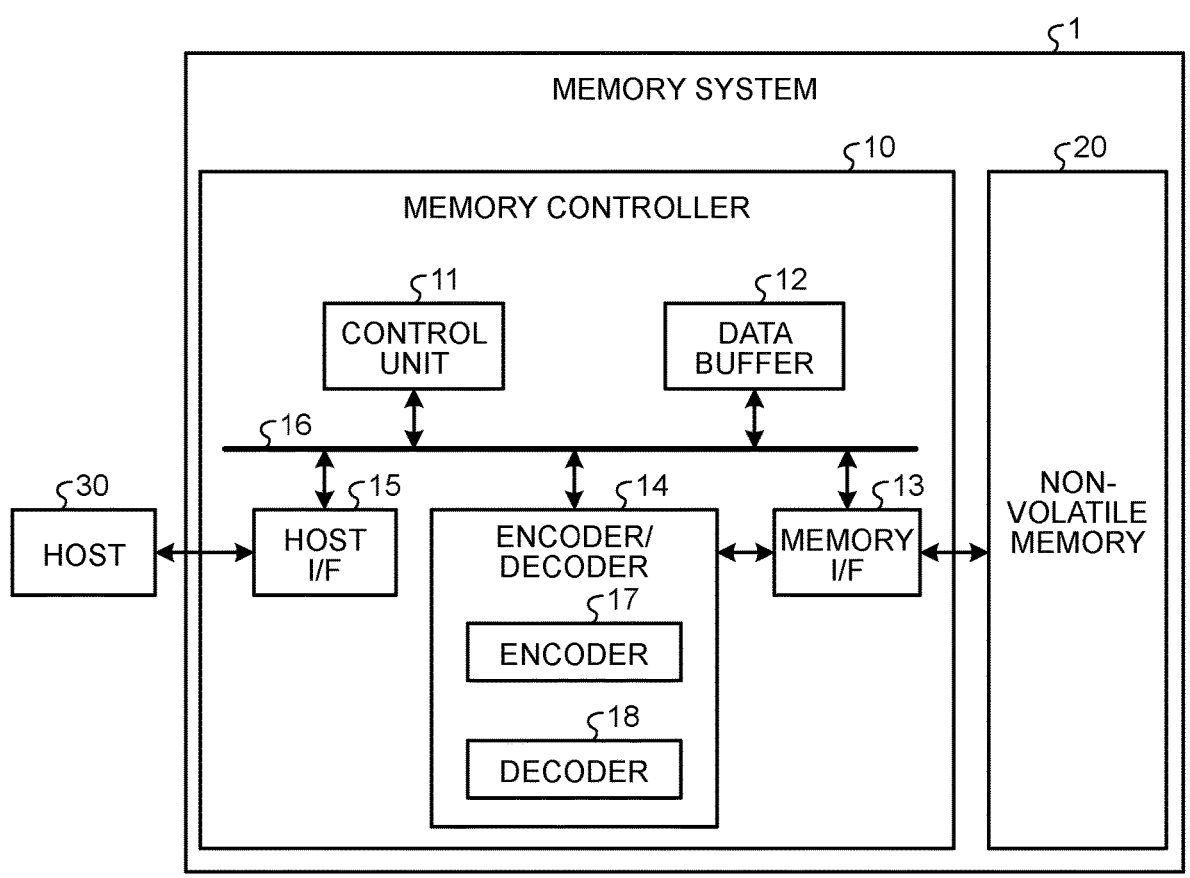
FIG. 1 is a block diagram of a memory system according to an embodiment.

First, a memory system according to the present embodiment will be described in detail with reference to the drawings. FIG. 1 is a block diagram illustrating a schematic configuration example of a memory system according to the present embodiment. As illustrated in FIG. 1, a memory system 1 includes a memory controller 10 and a nonvolatile memory 20. The memory system 1 can be connected to a host 30 and is illustrated in a state connected to the host 30, in FIG. 1. The host 30 may be an electronic device such as a personal computer or a mobile terminal.

The nonvolatile memory 20 is a nonvolatile memory that stores data in a nonvolatile manner, and an example of this is a NAND flash memory (hereinafter simply referred to as NAND memory). The following description uses an exemplary case where the NAND memory is used as the nonvolatile memory 20. However, the nonvolatile memory 20 can include storage devices such as a three-dimensional structure flash memory, Resistive Random Access Memory (ReRAM), or Ferroelectric Random Access Memory (FeRAM), other than the NAND memory. The nonvolatile memory 20 need not be a semiconductor memory. The present embodiment can be applied to various storage media other than the semiconductor memory.

The memory system 1 may be various memory systems including the nonvolatile memory 20, such as a Solid State Drive (SSD) or a memory card incorporating the memory controller 10 and the nonvolatile memory 20 as one package.

The memory controller 10 controls writing to the nonvolatile memory 20 in accordance with a write request from the host 30. The memory controller 10 controls reading from the nonvolatile memory 20 in accordance with a read request from the host 30. An example of the memory controller 10 is a semiconductor integrated circuit configured as a System On a Chip (SoC). The memory controller 10 includes a host interface (host I/F) 15, a memory interface (memory I/F) 13, a control unit 11, an encoder/decoder (codec) 14, and a data buffer 12. The host I/F 15, the memory I/F 13, the control unit 11, the encoder/decoder 14, and the data buffer 12 are interconnected via an internal bus 16. Part or all of the operation of each of components of the memory controller 10 described below may be implemented by execution of firmware by a central processing unit (CPU) or may be implemented by hardware.

The host I/F 15 performs a process according to an interface standard with respect to the host 30, and outputs a command received from the host 30, user data to be written, or the like to the internal bus 16. The host I/F 15 transmits user data read from the nonvolatile memory 20 and restored, a response from the control unit 11, or the like to the host 30.

The memory I/F 13 performs writing processing to the nonvolatile memory 20 based on an instruction from the control unit 11. Further, the memory I/F 13 performs reading processing from the nonvolatile memory 20 based on an instruction from the control unit 11.

The control unit 11 comprehensively controls each of components of the memory system 1. In a case where a command is received from the host 30 via the host I/F 15, the control unit 11 performs control according to the command. For example, the control unit 11 instructs the memory I/F 13 to write user data and parity data to the nonvolatile memory 20 in accordance with a command from the host 30. Further, the control unit 11 instructs the memory I/F 13 to read user data and parity data from the nonvolatile memory 20 in accordance with a command from the host 30.

Moreover, in a case where a write request is received from the host 30, the control unit 11 determines a storage region (memory region) on the nonvolatile memory 20 for user data stored in the data buffer 12. That is, the control unit 11 manages the writing destination of user data. The correspondence between the logical address of the user data received from the host 30 and the physical address indicating the storage region on the nonvolatile memory 20 that stores the user data will be stored as an address conversion table.

Moreover, in a case where a read request is received from the host 30, the control unit 11 converts the logical address designated by the read request into a physical address using the above-described address conversion table, and instructs the memory I/F 13 to perform reading from the physical address.

In typical cases, a NAND memory performs writing and reading in data units referred to as a page, and performs erasing in data units referred to as a block. In the present embodiment, a plurality of memory cells connected to an identical word line is referred to as a memory cell group. In a case where the memory cell is a single level cell (SLC), one memory cell group corresponds to one page. In a case where the memory cell is a multiple level cell (MLC), one memory cell group corresponds to a plurality of pages. In the present description, an MLC includes a Triple Level Cell (TLC), and a Quad Level Cell (QLC). Each of memory cells is connected to a word line as well as to a bit line. Therefore, each of memory cells can be identified by an address for identifying a word line and an address for identifying a bit line.

The data buffer 12 temporarily stores user data received by the memory controller 10 from the host 30 until the user data is stored in the nonvolatile memory 20. The data buffer 12 temporarily stores the user data read from the nonvolatile memory 20 until the user data is transmitted to the host 30. The data buffer 12 can be implemented by using a general-purpose memory such as Static Random Access Memory (SRAM) or Dynamic Random Access Memory (DRAM). The data buffer 12 may be mounted outside of the memory controller 10, rather than being built in the memory controller 10.

User data transmitted from the host 30 is transferred to the internal bus 16 and temporarily stored in the data buffer 12. The encoder/decoder 14 encodes user data stored in the nonvolatile memory 20 to generate a codeword. The encoder/decoder 14 also decodes the received word read from the nonvolatile memory 20 and restores user data. Accordingly, the encoder/decoder 14 includes an encoder 17 and a decoder 18. The data encoded by the encoder/decoder 14 may include control data used inside the memory controller 10, in addition to user data.

Next, the writing processing according to the present embodiment will be described. The control unit 11 instructs the encoder 17 to encode user data at writing to the nonvolatile memory 20. At that time, the control unit 11 determines a storage location (storage address) of the codeword in the nonvolatile memory 20, and instructs the memory I/F 13 about the determined storage location.

Based on the instruction from the control unit 11, the encoder 17 encodes the user data on the data buffer 12 to generate a codeword. Example of applicable coding methods include a coding method using an algebraic code such as a Bose-Chaudhuri-Hocquenghem (BCH) code and a Reed-Solomon (RS) code, and a coding method (product code or the like) using these codes as component codes in the row direction and the column direction. The memory I/F 13 performs control to store the codeword to the storage location on the nonvolatile memory 20 instructed by the control unit 11. Hereinafter, a case of using a BCH code that corrects 3-bit errors or less will be described as an example.

Next, the processing at the time of reading from the nonvolatile memory 20 of the present embodiment will be described. At the time of reading from the nonvolatile memory 20, the control unit 11 designates an address on the nonvolatile memory 20 and instructs the memory I/F 13 to perform reading. The control unit 11 also instructs the decoder 18 to start decoding. The memory I/F 13 reads a received word from the designated address of the nonvolatile memory 20 in accordance with an instruction from the control unit 11, and inputs the read received word to the decoder 18. The decoder 18 decodes the received word read from the nonvolatile memory 20.

The decoder 18 decodes the received word read from the nonvolatile memory 20. The decoder 18 is configured such that, when the number of bit errors (hereinafter, the number of errors) is 2 or 3, calculation of an inverse element is performed once.

Figure 2:
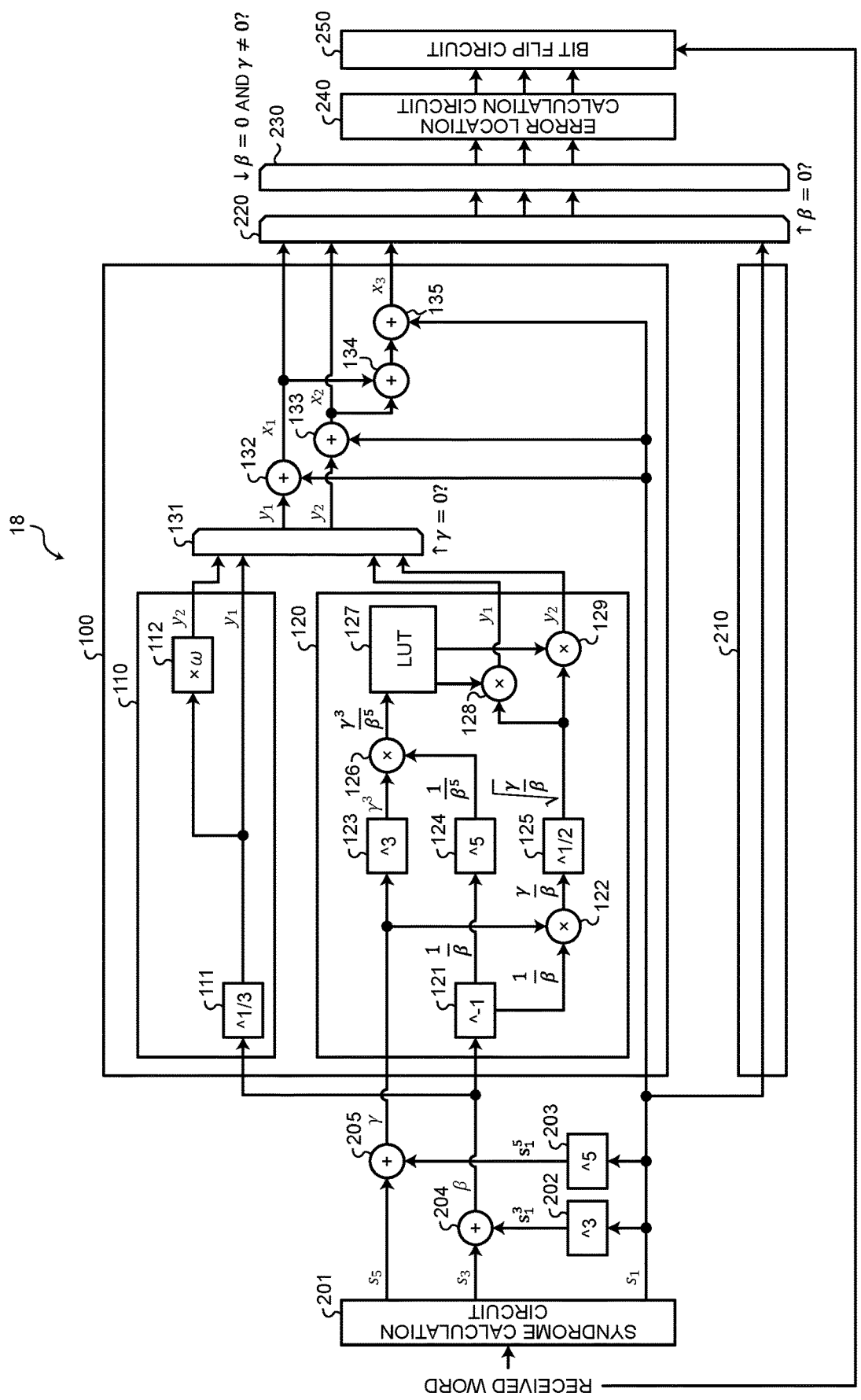
FIG. 2 is a block diagram of a decoder according to the embodiment.

FIG. 2 is a block diagram illustrating a configuration example of the decoder 18 according to the present embodiment. FIG. 2 illustrates an example in a case where the decoder 18 is implemented by a hardware circuit. As illustrated in FIG. 2, the decoder 18 includes a syndrome calculation circuit 201, arithmetic circuits 202 to 205, a root calculation circuit 100, a root calculation circuit 210, selection circuits 220 and 230, an error location calculation circuit 240, and a bit flip circuit 250.

The syndrome calculation circuit 201 has a received word r(x) as an input and calculates and outputs a syndrome. For example, when the received word is r(x):=c(x)+e(x), the syndrome calculation circuit 201 calculates syndrome $s_i$ by $s_i := r(\alpha^i)$. c(x) represents a codeword, and e(x) represents an error. $\alpha$ represents a primitive element of $GF(2^m)$. When using a BCH code that corrects 3-bit errors or less, the syndrome calculation circuit 201 has the received word r(x) as an input and outputs syndromes $s_1$, $s_3$, and $s_5$.

The arithmetic circuits 202 to 205 perform the following operations individually.

Arithmetic circuit 202: outputting syndrome $s_1$ raised to the power of 3 (an example of power calculation).

Arithmetic circuit 203: outputting syndrome $s_1$ raised to the power of 5 (an example of power calculation).

Arithmetic circuit 204: adding an output value of arithmetic circuit 202 and syndrome $s_3$, and outputting $\beta$ which is a result of the addition.

Arithmetic circuit 205: adding an output value of arithmetic circuit 203 and syndrome $s_5$, and outputting $\gamma$ which is a result of the addition.

Note that $\beta$ and $\gamma$ are examples of values calculated based on the syndromes. As described below, in the present embodiment and the modification, an inverse element of either $\beta$ or $\gamma$ is calculated.

The root calculation circuit 100 calculates the root of the second-order or third-order error locator polynomial used when the number of errors is 2 or 3. For example, the root calculation circuit 100 has $\beta$ and $\gamma$ as an input, and outputs roots $x_1$, $x_2$, and $x_3$ of the error locator polynomial. Details of the root calculation circuit 100 will be described below.

The root calculation circuit 210 calculates a root of a zeroth-order or first-order error locator polynomial used when the number of errors is 0 or 1. For example, the root calculation circuit 210 has syndrome $s_1$ as an input, and outputs syndrome $s_1$ as the root of the error locator polynomial.

The number of errors can be estimated as follows using the value of the syndrome. The number of errors and the value of the syndrome have the following relationships.

When the number of errors is 0 or 1, $s_1^3=s_3$.
When the number of errors is 0 or 1, $s_1^5=s_5$.
When the number of errors is 2 or 3, $s_1^3 \neq s_3$.

This relationship can be rephrased as follows.

When the number of errors is 0 or 1, $s_1^3=s_3$ and $s_1^5=s_5$.
When the number of errors is 2 or 3, $s_1^3 \neq s_3$.

Therefore, when ($s_1^3=s_3$ or $s_1^5 \neq s_5$) and ($s_1^3=s_3$) hold, (that is, when $s_1^3=s_3$ and $s_1^5 \neq s_5$), the number of errors is 4 or more. Assuming that the number of errors is 3 or less, the number of errors is 0 or 1 when ($s_1^3=s_3$).

Here, when $\beta$: $=s_1^3+s_3$, and $\gamma$: $=s_1^5+s_5$, $\beta=0$ is equivalent to $s_1^3=s_3$, and $\gamma=0$ is equivalent to $s_1^5=s_5$. Therefore, when $\beta$ and $\gamma$ are used, the following relationship is obtained with respect to the number of errors.

When ($\beta \neq 0$ or $\gamma \neq 0$) and ($\beta=0$) (that is, when $\beta=0$ and $\gamma \neq 0$,), the number of errors is 4 or more.

Assuming that the number of errors is 3 or less, when ($\beta=0$), the number of errors is 0 or 1.

The selection circuit 220 selects and outputs either the root output from the root calculation circuit 100 or the root output from the root calculation circuit 210 according to the number of errors. As described above, for example, $\beta=0$ means that the number of errors is 0 or 1. Accordingly, when $\beta=0$, the selection circuit 220 selects and outputs the root output by the root calculation circuit 210.

The selection circuit 230 selects and outputs either the input root or information indicating the correction failure according to the number of errors. As described above, for example, $\beta=0$ and $\gamma \neq 0$ means that the number of errors is 4 or more. Therefore, when $\beta=0$ and $\gamma \neq 0$, the selection circuit 230 outputs information indicating a correction failure.

The error location calculation circuit 240 has the root of the error locator polynomial as an input and outputs the error location. For example, when the roots $x_1$, $x_2$, and $x_3$ output from the root calculation circuit 100 are input, the error location calculation circuit 240 outputs the error locations $p_1$, $p_2$, and $p_3$. When syndrome $s_1$, which is the root output from the root calculation circuit 210, is input, the error location calculation circuit 240 outputs the error location $p_1$.

The bit flip circuit 250 has the received word r(x) and the error location output from the error location calculation circuit 240 as an input, and outputs a received word obtained by flipping the bit at the error location.

Next, details of the root calculation circuit 100 will be described. First, an error locator polynomial will be described.

The lth-order (l is an integer of 0 or more) error locator polynomial is expressed by the following Formula (1). For example, the error locator polynomial when l=0 to 3, that is, the zeroth-order to third-order error locator polynomials are expressed by the following Formulas (2) to (5).

[Mathematical Formula 1]

$$\prod_{k=1}^{l} (x - \alpha^{j_k}) \tag{1}$$

($j_k$: $k = 1, 2, \ldots, l - TH$ ERROR LOCATION, $\alpha$: A PRIMITIVE EMLEMENT OF $GF(2^m)$)

[Mathematical Formula 2]

$$\prod_{k=1}^{0} (x - \alpha^{j_k}) = 1 \tag{2}$$

[Mathematical Formula 3]

$$\prod_{k=1}^{1} (x - \alpha^{j_k}) = x + s_1 \tag{3}$$

[Mathematical Formula 4]

$$\prod_{k=1}^{2} (x - \alpha^{j_k}) = x^2 + s_1 x + \frac{s_1^3 + s_3}{s_1} \tag{4}$$

[Mathematical Formula 5]

$$\prod_{k=1}^{3} (x - \alpha^{j_k}) = x^3 + s_1 x^2 + \frac{s_1^2 s_3 + s_5}{s_1^3 + s_3} x + \frac{s_1^6 + s_1^3 s_3 + s_1 s_5 + s_3^2}{s_1^3 + s_3} \tag{5}$$

The root of zeroth-order and first-order error locator polynomials can be calculated collectively, as described below. Hereinafter, processing of collectively calculating the roots of the zeroth-order and first-order error locator polynomials is referred to as root calculation of the zeroth-order and first-order error locator polynomials. Similarly, the root of second-order and third-order error locator polynomials can be calculated collectively. Hereinafter, processing of collectively calculating the roots of the second-order and third-order error locator polynomials is referred to as root calculation of the second-order and third-order error locator polynomials.

First, root calculation of a zeroth and first-order error locator polynomial will be described. When the number of errors is 0, $s_1^3=s_3$ and $s_1=0$ hold, and when the number of errors is 1, $s_1^5=s_5$ and $s_1 \neq 0$ hold. Therefore, by assuming that $\sigma(x)=x+s_1$, and "find the roots of $\sigma(x)$ and removing 0 from the root of $\sigma(x)$", the root calculation of the zeroth and first-order error locator polynomial can be executed. This is derived from the following.

When the number of errors is 0, the root of $\sigma(x)$ is 0, since $s_1=0$. Therefore, by removing 0 from the root of $\sigma(x)$, the root of the zeroth-order error locator polynomial is determined.

When the number of errors is 1, the root of $\sigma(x)$ is $s_1$. Here, $s_1 \neq 0$ holds, and thus, the root of the first-order error locator polynomial does not include 0. That is, the root of the first-order error locator polynomial is not to be removed. Therefore, by removing 0 from the root of $\sigma(x)$, the root of the first-order error locator polynomial is determined.

Next, root calculation of the second and third-order error locator polynomial will be described. When the number of errors is 2, $s_1^3 \neq s_3$, $s_1^6+s_1 s_5=s_1^3 s_3+s_3^2$ hold. When the number of errors is 3, $s_1^3 \neq s_3$ and $s_1^6+s_1 s_5 \neq s_1^3 s_3+s_3^2$ hold. Therefore, by assuming that $\sigma(x)$ is expressed by the following Formula (6) and "find the roots of $\sigma(x)$ and removing 0 from root of $\sigma(x)$", the root calculation of the second and third-order error locator polynomial can be executed.

[Mathematical Formula 6]

$$\sigma(x) = x^3 + s_1 x^2 + \frac{s_1^2 s_3 + s_5}{s_1^3 + s_3} x + \frac{s_1^6 + s_1^3 s_3 + s_1 s_5 + s_3^2}{s_1^3 + s_3} \tag{6}$$

This is derived from the following.

When the number of errors is 2, the root of $\sigma(x)$ is the root of the second-order error locator polynomial and 0 based on the following Formula (7). Here, $(s_1^3+s_3)/s_1 \neq 0$ holds, and thus, the root of the second-order error locator polynomial does not include 0. That is, the root of the second-order error locator polynomial is not to be removed. Therefore, by removing 0 from the root of $\sigma(x)$, the root of the second-order error locator polynomial is determined.

When the number of errors is 3, the root of $\sigma(x)$ is to be the root of the third-order error locator polynomial. Here, based on the following Formula (8), the root of the third-order error locator polynomial does not include 0. That is, the root of the third-order error locator polynomial is not to be removed. Therefore, by removing 0 from the root of $\sigma(x)$, the root of the third-order error locator polynomial is determined.

[Mathematical Formula 7]

$$\sigma(x) = x^3 + s_1 x^2 + \frac{s_1^3 + s_3}{s_1} x = \left(x^2 + s_1 x + \frac{s_1^3 + s_3}{s_1}\right) x \quad (7)$$

[Mathematical Formula 8]

$$\frac{s_1^6 + s_1^3 s_3 + s_1 s_5 + s_3^2}{s_1^3 + s_3} \neq 0 \quad (8)$$

Next, a procedure of root calculation of $\sigma(x)$ expressed by Formula (6) will be described. When a variable x and a variable y are transformed by the variable transformation represented by $x=y+s_1$, then, $\sigma(x)$ is represented by the following Formula (9).

[Mathematical Formula 9]

$$\sigma(x) = (y+s_1)^3 + s_1(y+s_1)^2 + \frac{s_1^3 s_3 + s_5}{s_1^3 + s_3}(y+s_1) + \frac{s_1^6 + s_1^3 s_3 + s_1 s_5 + s_3^2}{s_1^3 + s_3} \quad (9)$$

$$= y^3 + \frac{s_1^5 + s_5}{s_1^3 + s_3} y + s_1^3 + s_3$$

Formula (9) corresponds to a polynomial obtained by transforming the error locator polynomial in accordance with the variable transformation of $x=y+s_1$. Hereinafter, the polynomial obtained by transforming the error locator polynomial according to the variable transformation in this manner may be referred to as a transformed polynomial.

Here, let $\beta := s_1^3 + s_3$ and $\gamma := s_1^5 + s_5$, then $\sigma(x)$ is expressed by the following Formula (10). Hereinafter, the case (C1) $\gamma=0$ and the case (C2) $\gamma \neq 0$ will be described separately.

[Mathematical Formula 10]

$$\sigma(x) = y^3 + \frac{\gamma}{\beta} y + \beta \quad (10)$$

Case(C1)$\gamma=0$

Based on the following Formula (11), the roots $y_1$, $y_2$, and $y_3$ are determined by using correspondence information (such as a lookup table: LUT) that returns the cube root of $\beta$ by using $\beta$ as key information. The LUT is an example of correspondence information in which a plurality of values that can be taken by the key information and the root of the transformed polynomial are associated with each other, and any other form of correspondence information may be used.

[Mathematical Formula 11]

$$\sigma(x) = y^3 + \beta \quad (11)$$

Case(C2)$\gamma \neq 0$

Assuming that the variable y and the variable z are transformed by the variable transformation expressed by the following Formula (12), roots $z_1$, $z_2$, and $z_3$ are determined by using the LUT that returns the root of the polynomial expressed by the following Formula (14) using $\gamma^3/\beta^5$ as key information based on the following Formula (13).

[Mathematical Formula 12]

$$y = \sqrt{\frac{\gamma}{\beta}} z \quad (12)$$

[Mathematical Formula 13]

$$\sigma(x) = \left(\sqrt{\frac{\gamma}{\beta}} z\right)^3 + \frac{\gamma}{\beta}\left(\sqrt{\frac{\gamma}{\beta}} z\right) + \beta = \left(\sqrt{\frac{\gamma}{\beta}}\right)^3 \left(z^3 + z + \sqrt{\frac{\beta^5}{\gamma^3}}\right) \quad (13)$$

[Mathematical Formula 14]

$$z^3 + z + \sqrt{\frac{\beta^5}{\gamma^3}} \quad (14)$$

Furthermore, by multiplying each of the obtained roots $z_1$, $z_2$, and $z_3$ by $\sqrt{(\gamma/\beta)}$, it is possible to determine roots $y_1$, $y_2$, and $y_3$ of $\sigma(x)$. Note that "$\sqrt{(\ )}$" represents the square root (squared root) of the value in parentheses. Furthermore, by adding $s_1$ to each of the obtained roots $y_1$, $y_2$, and $y_3$, it is possible to determine roots $x_1$, $x_2$, and $x_3$ of $\sigma(x)$.

Note that the cube root $y_2$ and $y_3$ of $\beta$ may be determined by $y_2=y_1\omega$ and $y_3=y_1\omega^2$ using the cube root $y_1$ of $\beta$, where $\omega$ is the cube root of 1.

Alternatively, the root $x_3$ of $\sigma(x)$ may be determined by $x_3=x_1+x_2+s_1$ using the roots $x_1$ and $x_2$ of $\sigma(x)$. In this case, it is only necessary to determine the roots $y_1$ and $y_2$ and the roots $z_1$ and $z_2$.

It is conceivable to use a method of obtaining the root of Formula (14), which is a method using a LUT with $\sqrt{(\beta^5/\gamma^3)}$ included in the Formula (14) itself as key information. Hereinafter, a comparative example configured as described above will be described. In the comparative example, when $\gamma \neq 0$, the roots $z_1$, $z_2$, and $z_3$ are determined by using $\sqrt{(\beta^5/\gamma^3)}$ as key information and using a LUT that returns the root of the polynomial expressed by Formula (14). The subsequent processing of determining the roots $y_1$, $y_2$, and $y_3$ from the roots $z_1$, $z_2$, and $z_3$ and the processing of determining the roots $x_1$, $x_2$, and $x_3$ from the roots $y_1$, $y_2$, and $y_3$ are similar to the processing of the present embodiment.

The comparative example needs calculation of the following two inverse elements.
$1/\gamma$ used to calculate the key information $\sqrt{(\beta^5/\gamma^3)}$.
$1/\beta$ used to calculate $\sqrt{(\gamma/\beta)}$ to be multiplied by the roots $z_1$, $z_2$, and $z_3$ when determining the roots $y_1$, $y_2$, and $y_3$.

In contrast, the present embodiment does not use a LUT having a coefficient $\sqrt{(\beta^5/\gamma^3)}$ itself included in Formula (14) but uses a LUT having $\gamma^3/\beta^5$ as key information. In other words, the present embodiment uses $\gamma^3/\beta^5$, which is key information that uniquely determines the coefficient $\sqrt{(\beta^5/\gamma^3)}$ included in Formula (14). With this operation, the present embodiment is only necessary to perform the following calculation of one inverse element.

$1/\beta$ used to calculate the key information $\gamma^3/\beta^5$ and $\sqrt{(\gamma/\beta)}$.

In other words, in the present embodiment, the variable transformation (for example, Formula (12)) and the calculation of the root of the transformed polynomial (for example, Formula (13)) can be executed using one inverse element calculation.

The present embodiment can be interpreted that a LUT that returns the root of the polynomial expressed by the following Formula (15) is to be used in a case where the input is c. In contrast, the comparative example can be interpreted that a LUT that returns the root of the polynomial $z^3+z+c$ is to be used when the input is c.

[Mathematical Formula 15]

$$z^3 + z + \sqrt{\frac{1}{c}} \qquad (15)$$

In this manner, by changing the key information used in the LUT, the inverse element calculation can be reduced from twice to once in the present embodiment.

The root calculation circuit 100 is configured to execute root calculation of the second and third-order error locator polynomial as described above. Details of the root calculation circuit 100 of FIG. 2 will be described. The root calculation circuit 100 includes root calculation circuits 110 and 120, a selection circuit 131, and arithmetic circuits 132 to 135.

The root calculation circuit 110 calculates the root at the case (C1) $\gamma=0$. The root calculation circuit 110 includes a LUT 111 and an arithmetic circuit 112. The LUT 111 and the arithmetic circuit 112 execute the following operations individually.

LUT 111: outputting a root $y_1$ which is the cube root of $\beta$.

Arithmetic circuit 112: multiplying the root $y_1$ by $\omega$ (cube root of 1) to output root $y_2$ as a result of the multiplication.

The root calculation circuit 120 performs the root calculation for the case (C2) $\gamma \neq 0$. The root calculation circuit 120 includes arithmetic circuits 121 to 126, a LUT 127, and arithmetic circuits 128 and 129. The arithmetic circuit 121 to 126, the LUT 127, and the arithmetic circuits 128 and 129 execute the following operations, individually.

Arithmetic circuit 121: calculating an inverse element $1/\beta$ of $\beta$ (inverse element calculation circuit).

Arithmetic circuit 122: multiplying inverse element $1/\beta$ and $\gamma$, and outputting $\gamma/\beta$ which is a result of the multiplication.

Arithmetic circuit 123: calculating $\gamma^3$ which is a cube of $\gamma$ (an example of power calculation).

Arithmetic circuit 124: calculating $1/\beta^5$, which is the 5th power of the inverse element $1/\beta$ (an example of power calculation).

Arithmetic circuit 125: calculating square root $\sqrt{(\gamma/\beta)}$ of $\gamma/\beta$.

Arithmetic circuit 126: multiplying $\gamma^3$ and $1/\beta^5$, and outputting $\gamma^3/\beta^5$ which is a result of the multiplication.

LUT 127 outputting roots $z_1$ and $z_2$ with $\gamma^3/\beta^5$ as key information.

Arithmetic circuit 128: multiplying root $z_1$ by $\sqrt{(\gamma/\beta)}$, and outputting root $y_1$ as a result of the multiplication.

Arithmetic circuit 129: multiplying root $z_2$ by $\sqrt{(\gamma/\beta)}$, and outputting root $y_2$ as a result of the multiplication.

Depending on whether $\gamma$ is 0, the selection circuit 131 selects and outputs either: the roots $y_1$ and $y_2$ calculated by the root calculation circuit 110; or the roots $y_1$ and $y_2$ calculated by the root calculation circuit 120.

The arithmetic circuit 132 to 135 performs the following operations individually.

Arithmetic circuit 132: adding syndrome $s_1$ to root $y_1$, and outputting root $x_1$ as a result of the addition.

Arithmetic circuit 133: adding syndrome $s_1$ to root $y_2$, and outputting root $x_2$ as a result of the addition.

Arithmetic circuit 134: adding root $x_2$ to root $x_1$, and outputting $x_1+x_2$ as a result of the addition.

Arithmetic circuit 135: adding syndrome $s_1$ to $x_1+x_2$, and outputting root $x_3$ as a result of the addition.

The arithmetic operations by the arithmetic circuits 132 to 135 can be interpreted as arithmetic operations of executing inverse transformation of variable transformation (variable inverse transformation) on the roots $y_1$ and $y_2$ of the transformed polynomial to determine the roots $x_1$, $x_2$, and $x_3$ of the error locator polynomial.

Figure 3:
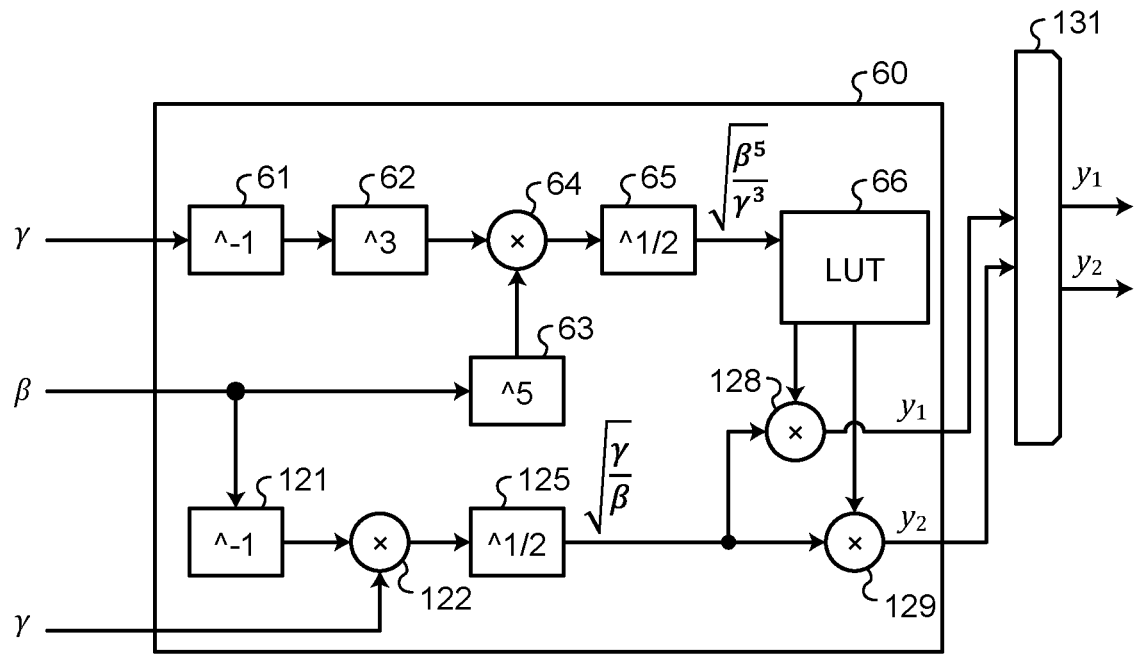
FIG. 3 is a diagram illustrating a configuration example of a circuit of a comparative example.

Here, a configuration example of a circuit of a comparative example will be described. FIG. 3 is a diagram illustrating a configuration example of a circuit of the comparative example. In the comparative example, the configuration of the root calculation circuit 120 is different from the configuration of the present embodiment. Therefore, FIG. 3 mainly illustrates a root calculation circuit 60 of the comparative example corresponding to the root calculation circuit 120. Hereinafter, the root calculation circuit 60 will be described. The same components as those in FIG. 2 are denoted by the same reference numerals, and the description thereof will be omitted.

The root calculation circuit 60 includes arithmetic circuits 61 to 65, a LUT 66, and arithmetic circuits 121, 122, 125, 128, and 129. The arithmetic circuit 61 to 65 and the LUT 66 perform the following operations individually.

Arithmetic circuit 61: calculating inverse element $1/\gamma$ of $\gamma$ (inverse element calculation circuit).

Arithmetic circuit 62: calculating $1/\gamma^3$ which is the cube of inverse element $1/\gamma$.

Arithmetic circuit 63: calculating $\beta^5$ which is the 5th power of $\beta$.

Arithmetic circuit 64: multiplying $1/\gamma^3$ and $\beta^5$, and outputting $\beta^5/\gamma^3$ which is a result of the multiplication.

Arithmetic circuit 65: calculating square root $\sqrt{(\beta^5/\gamma^3)}$ of $\beta^5/\gamma^3$.

LUT 66: Outputting roots $z_1$ and $z_2$ using $\sqrt{(\beta^5/\gamma^3)}$ as key information.

In this manner, in the comparative example, two arithmetic circuits 61 and 121 are required as inverse element calculation circuits. In contrast, the present embodiment only needs to have one inverse element calculation circuit (arithmetic circuit 121). The inverse element calculation circuit can be larger in circuit scale than other arithmetic circuits. Even in such a case, the number of inverse element calculation circuits can be reduced according to the present embodiment, making is possible to further efficiently reduce the circuit scale of the decoder 18.

In a case where the decoder 18 is implemented by a CPU and firmware, the firmware can be configured to execute one inverse element calculation for root calculation of a second and third-order error locator polynomial. That is, firmware for executing error correction (decoding) can be formed with a simpler configuration.

Figure 4:
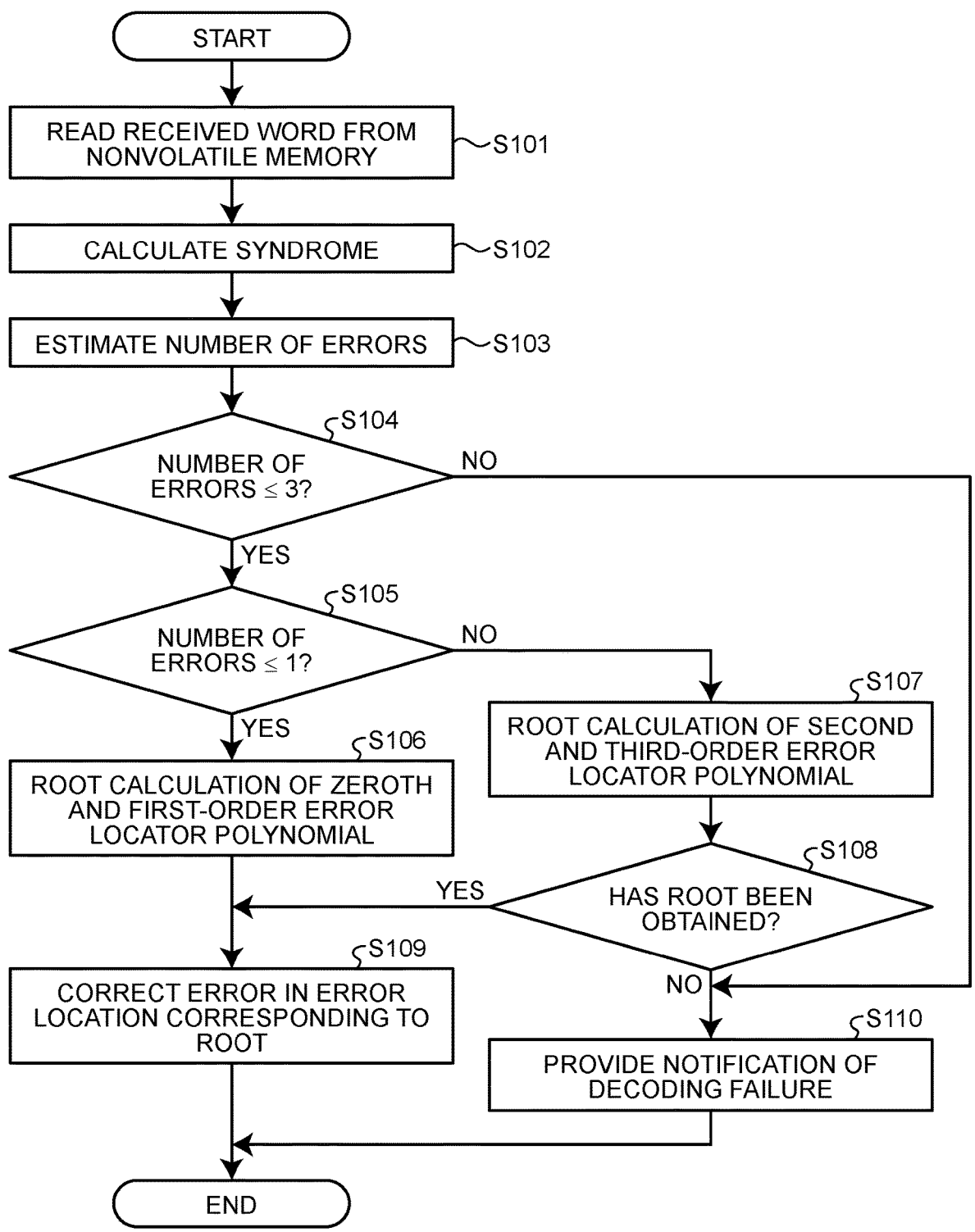
FIG. 4 is a flowchart of decoding processing according to the embodiment.

Next, a flow of decoding processing by the memory system 1 will be described. FIG. 4 is a flowchart illustrating an example of decoding processing according to the present embodiment.

The control unit 11 reads the error correcting code from the nonvolatile memory 20, and obtains a received word (Step S101). The control unit 11 also instructs the decoder 18 to start decoding.

The syndrome calculation circuit 201 of the decoder 18 calculates a syndrome from the received word (Step S102).

Next, the decoder 18 estimates the number of errors (Step S103). The decoder 18 judges whether the number of errors is 3 or less (Step S104). In a case where the number of errors is larger than 3 (Step S104: No), the decoder 18 provides notification of a decoding failure (Step S110), and ends the decoding processing.

When the number of errors is 3 or less (Step S104: Yes), the decoder 18 further judges whether the number of errors is 1 or less (Step S105). In a case where the number of errors is 1 or less (Step S105: Yes), the decoder 18 executes root calculation of a zeroth and first-order error locator polynomial (Step S106). When the number of errors is not 1 or less (Step S105: No), the decoder 18 executes root calculation of the second and third-order error locator polynomial (Step S107).

When having executed the root calculation of the second and third-order error locator polynomial, the decoder 18 judges whether the root has been obtained by the root calculation of the second and third-order error locator polynomial (Step S108).

For the second and third-order error locator polynomials, there is a case where no root exists for the value of $\gamma^3/\beta^5$. In such a case, for example, the LUT is constructed to associate information indicating absence of root with the key information of the LUT corresponding to this value. When the information indicating that the absence of root is obtained from the LUT, the decoder 18 judges that the root cannot be obtained. Note that syndrome $s_1$ is always obtained as a root for the zeroth and first-order error locator polynomial.

When the root has not been obtained (Step S108: No), the decoder 18 provides notification of a decoding failure (Step S110), and ends the decoding processing.

When the root has been obtained (Step S108: Yes), and after the root calculation of the zeroth and first-order error locator polynomial, the decoder 18 corrects the error of the error location corresponding to the root (Step S109), and ends the decoding processing.

The decoder 18 may judge whether the values of all the syndromes are 0 after calculating the syndromes in Step S102, for example, and may end the decoding processing when all the syndromes are 0. This is because when all syndromes are 0, it can be determined that there is no error in the received word.

Although the above has described a case of using the BCH code that corrects 3-bit errors or less as an example, the similar procedure can also be applied to a configuration using a BCH code that corrects n-bit errors (n is an integer of 3 or more) or less. For example, in a case of using a BCH code for correcting 5-bit errors or less, the above procedure can be applied to decoding in a case where the number of errors is 0 to 3. Any procedure may be used for decoding in a case where the number of errors is 4 or 5.

The calculation of the root at $\gamma \neq 0$ is not limited to the above, and may be configured as the following modifications. Hereinafter, a modification in which variable transformation different from the above-described embodiment is performed will be described. Each variable transformation is a transformation in which the root of the transformed polynomial obtained by transforming the error locator polynomial according to the variable transformation is determined for one piece of key information. Variable transformation different from the following modification may be used as long as the transformation is performed in this manner.

In each modification, the procedure of the root calculation of the second and third-order error locator polynomial (the configuration of the root calculation circuit 120) is different from the configuration of the above embodiment, while other functions are similar to those of the above embodiment. Therefore, details of the root calculation circuit of each modification will be described below. In the root calculation circuit of each modification, an internal arithmetic circuit or the like can have a function similar to the function of the above embodiment. Such a configuration is denoted by the same reference numeral as that of the above-described embodiment, and description thereof is omitted.

(First Modification)

Root calculation of the second and third-order error locator polynomial in the first modification will be described. In the present modification, here is an assumable case where the variable y and the variable z are transformed by the variable transformation expressed by the following Formula (16). In this case, by using a LUT that returns a value obtained by adding 1 to the roots $z_1$, $z_2$, and $z_3$ of the polynomial expressed by Formula (18) with $\gamma^3/\beta^5$ as key information based on the following Formula (17), $z_1+1$, $z_2+1$, and $z_3+1$ are each determined.

[Mathematical Formula 16]

$$y = \sqrt{\frac{\gamma}{\beta}}(z+1) \qquad (16)$$

[Mathematical Formula 17]

$$\sigma(x) = \left(\sqrt{\frac{\gamma}{\beta}}(z+1)\right)^3 + \frac{\gamma}{\beta}\left(\sqrt{\frac{\gamma}{\beta}}(z+1)\right) + \beta = \left(\sqrt{\frac{\gamma}{\beta}}\right)^3\left(z^3 + z^2 + \sqrt{\frac{\beta^5}{\gamma^3}}\right) \qquad (17)$$

[Mathematical Formula 18]

$$z^3 + z^2 + \sqrt{\frac{\beta^5}{\gamma^3}} \qquad (18)$$

Furthermore, by multiplying each of obtained values $z_1+1$, $z_2+1$, and $z_3+1$ by $\sqrt{(\gamma/\beta)}$, it is possible to determine roots $y_1$, $y_2$, and $y_3$ of $\sigma(x)$. Furthermore, by adding $s_1$ to each of the obtained roots $y_1$, $y_2$, and $y_3$, it is possible to determine roots $x_1$, $x_2$, and $x_3$ of $\sigma(x)$.

The present modification can be interpreted that a LUT that returns a value obtained by adding 1 to the root of the polynomial expressed by Formula (19) is used in a case where the input is c.

[Mathematical Formula 19]

$$z^3 + z^2 + \sqrt{\frac{1}{c}} \qquad (19)$$

Figure 5:
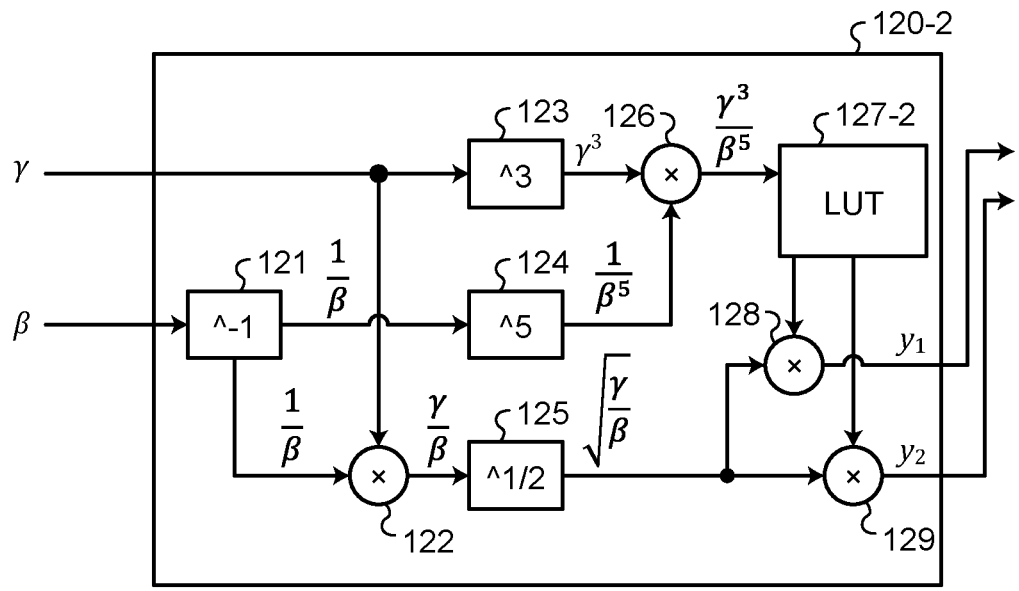
FIG. 5 is a diagram illustrating a configuration example of a root calculation circuit according to the first modification.

FIG. 5 is a diagram illustrating a configuration example of a root calculation circuit 120-2 of the present modification. As illustrated in FIG. 5, the root calculation circuit 120-2 includes arithmetic circuits 121 to 126, a LUT 127-2, and arithmetic circuits 128 and 129. In the present modification, the configuration of the LUT 127-2 is different from the configuration of the above embodiment.

The LUT 127-2 outputs values $z_1+1$ and $z_2+1$ obtained by adding 1 to the roots $z_1$ and $z_2$ with $\gamma^3/\beta^5$ as key information. Although there is a difference in values to be input to the arithmetic circuits 128 and 129, the arithmetic operations (multiplication) to be executed are similar to the case of the above embodiment. For example, the arithmetic circuits 128 and 129 is only required to perform multiplication using values $z_1+1$ and $z_2+1$ instead of the roots $z_1$ and $z_2$, respectively.

(Second Modification)

Root calculation of the second and third-order error locator polynomial in a second modification will be described. In the present modification, assuming that the variable y and the variable z are transformed by the variable transformation expressed by the following Formula (20), $z_1$, $z_2$, and $z_3$ are determined by using the LUT that returns the root of the polynomial expressed by Formula (22) with $\beta^5/\gamma^3$ as key information based on the following Formula (21).

[Mathematical Formula 20]

$$y = \frac{\beta^2}{\gamma} z \tag{20}$$

[Mathematical Formula 21]

$$\sigma(x) = \left(\frac{\beta^2}{\gamma}z\right)^3 + \frac{\gamma}{\beta}\left(\frac{\beta^2}{\gamma}z\right) + \beta = \left(\frac{\beta^2}{\gamma}\right)^3\left(z^3 + \frac{\gamma^3}{\beta^5}z + \frac{\gamma^3}{\beta^5}\right) \tag{21}$$

[Mathematical Formula 22]

$$z^3 + \frac{\gamma^3}{\beta^5}z + \frac{\gamma^3}{\beta^5} \tag{22}$$

In addition, by multiplying each of the obtained values $z_1$, $z_2$, and $z_3$ by $\beta^2/\gamma$, it is possible to determine roots $y_1$, $y_2$, and $y_3$ of $\sigma(x)$. Furthermore, by adding $s_1$ to each of the obtained roots $y_1$, $y_2$, and $y_3$, it is possible to determine roots $x_1$, $x_2$, and $x_3$ of $\sigma(x)$.

The present modification can be interpreted that a LUT that returns the root of the polynomial expressed by Formula (23) is used in a case where the input is c.

[Mathematical Formula 23]

$$z^3 + \frac{1}{c}z + \frac{1}{c} \tag{23}$$

Figure 6:
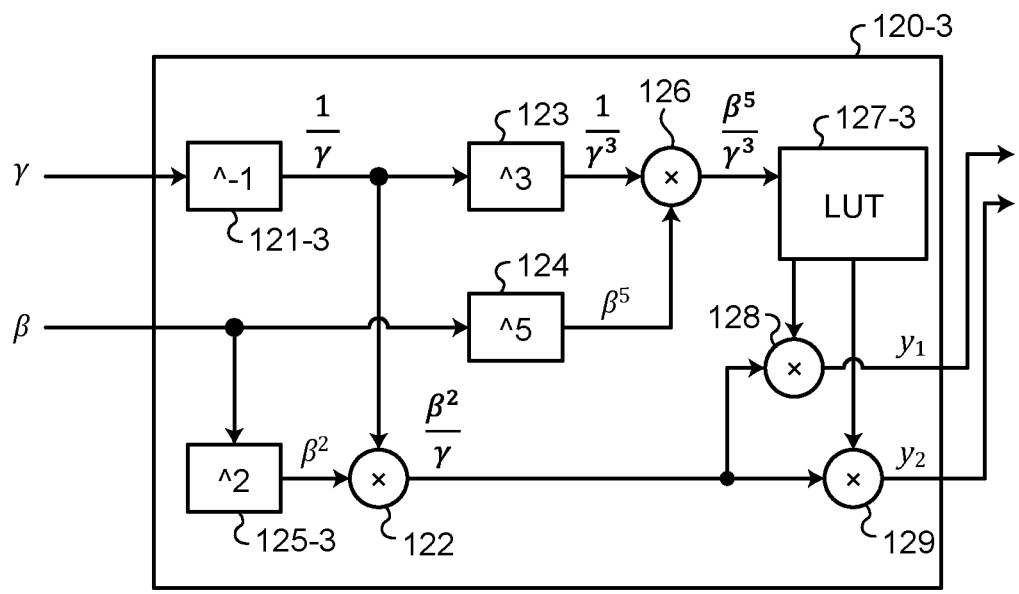
FIG. 6 is a diagram illustrating a configuration example of a root calculation circuit according to the second modification.

FIG. 6 is a diagram illustrating a configuration example of a root calculation circuit 120-3 of the present modification. As illustrated in FIG. 6, the root calculation circuit 120-3 includes arithmetic circuits 121-3a, 121-3b, 122 to 124, and 126, a LUT 127-3, and arithmetic circuits 128 and 129. The present modification is different from the above embodiment in the configuration of the LUT 127-3 and that arithmetic circuits 121-3 and 125-3 are provided instead of the arithmetic circuits 121 and 125 respectively.

The arithmetic circuits 121-3 and 125-3 perform the following operations individually.

Arithmetic circuit 121-3: calculating an inverse element $1/\gamma$ of $\gamma$ (inverse element calculation circuit).

Arithmetic circuit 125-3: calculating $\beta^2$ which is the square of $\beta$.

The LUT 127-3 outputs the roots $z_1$ and $z_2$ with $\beta^5/\gamma^3$ as key information. Although there is a difference in values to be input to the arithmetic circuits 122-124, 126, 128 and 129, the arithmetic operations to be executed are similar to the case of the above embodiment.

(Third Modification)

In the third modification, here is an assumable case where the variable y and the variable z are transformed by the variable transformation expressed by the following Formula (24). In this case, by using a LUT that returns a value obtained by adding 1 to the roots of the polynomial expressed by Formula (26) with $\beta^5/\gamma^3$ as key information based on the following Formula (25), $z_1+1$, $z_2+1$, and $z_3+1$ are each determined.

[Mathematical Formula 24]

$$y = \frac{\beta^2}{\gamma}(z+1) \tag{24}$$

[Mathematical Formula 25]

$$\sigma(x) = \left(\frac{\beta^2}{\gamma}(z+1)\right)^3 + \frac{\gamma}{\beta}\left(\frac{\beta^2}{\gamma}(z+1)\right) + \beta = \left(\frac{\beta^2}{\gamma}\right)^3\left(z^3 + z^2 + \left(1 + \frac{\gamma^3}{\beta^5}\right)z + 1\right) \tag{25}$$

[Mathematical Formula 26]

$$z^3 + z^2 + \left(1 + \frac{\gamma^3}{\beta^5}\right)z + 1 \tag{26}$$

Furthermore, by multiplying each of obtained values $z_1+1$, $z_2+1$, and $z_3+1$ by $\beta^2/\gamma$, it is possible to determine roots $y_1$, $y_2$, and $y_3$ of $\sigma(x)$. Furthermore, by adding $s_1$ to each of the obtained roots $y_1$, $y_2$, and $y_3$, it is possible to determine roots $x_1$, $x_2$, and $x_3$ of $\sigma(x)$.

The present modification can be interpreted that a LUT that returns a value obtained by adding 1 to the root of the polynomial expressed by Formula (27) is used in a case where the input is c.

[Mathematical Formula 27]

$$z^3 + z^2 + \left(1 + \frac{1}{c}\right)z + 1 \tag{27}$$

Figure 7:
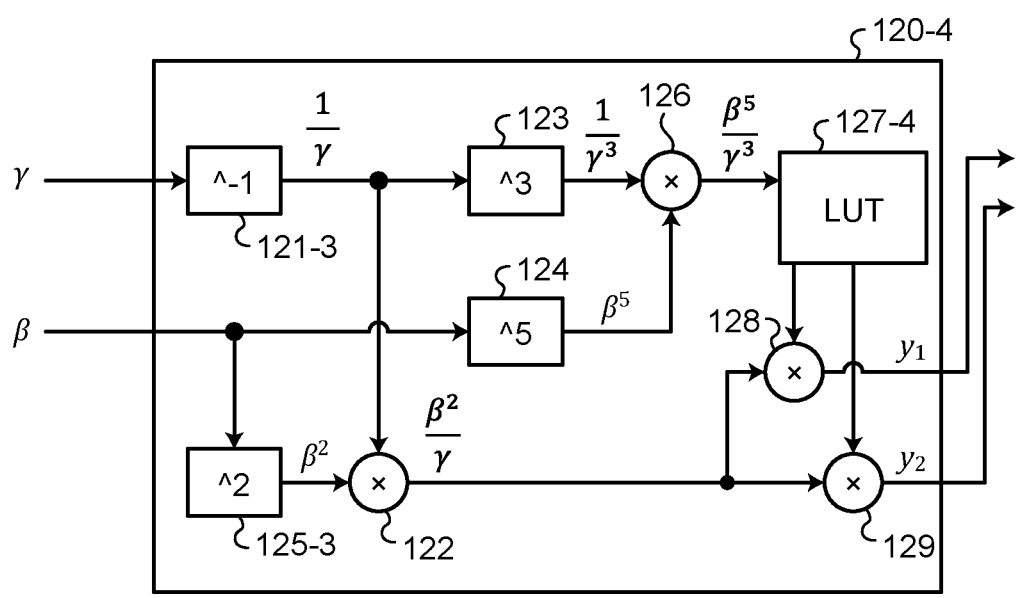
FIG. 7 is a diagram illustrating a configuration example of a root calculation circuit according to the third modification.

FIG. 7 is a diagram illustrating a configuration example of a root calculation circuit 120-4 of the present modification. As illustrated in FIG. 7, the root calculation circuit 120-3 includes arithmetic circuits 121-3122 to 124, 125-3, and 126, a LUT 127-4, and arithmetic circuits 128 and 129. In the present modification, the configuration of the LUT 127-3 is different from the configuration of the third modification.

The LUT 127-4 outputs values $z_1+1$ and $z_2+1$ obtained by respectively adding 1 to the roots $z_1$ and $z_2$, with $\beta^5/\gamma^3$ as key information. Although there is a difference in values to be input to the arithmetic circuits 128 and 129, the arithmetic operations to be executed are similar to the case of the third modification.

As described above, according to the present embodiment, error correction (decoding) can be executed with a simpler configuration.

What is claimed is:

1. A memory system comprising:
   a nonvolatile memory that stores data encoded with an error correcting code for correcting n-bit errors or less, n being an integer of 3 or more; and a memory controller that:

reads a received word from the nonvolatile memory;

calculates a syndrome using the read received word;

estimates the number of bit errors using the syndrome;

calculates an inverse element of a value calculated based on the syndrome in a case where the number of bit errors is 2 or 3;

executes, by using the inverse element, variable transformation on a variable of an error locator polynomial corresponding to the number of bit errors and calculation of a root of a transformed polynomial obtained by transforming the error locator polynomial according to the variable transformation;

executes variable inverse transformation on a root of the transformed polynomial to obtain a root of the error locator polynomial; and corrects an error of an error location corresponding to the root of the error locator polynomial.

2. The memory system according to claim 1, wherein, when the number of bit errors is 2 or 3, the memory controller calculates the inverse element, calculates key information by at least one of multiplication and power calculation on the inverse element, and determining the root corresponding to the calculated key information by using correspondence information in which a plurality of values that can be taken by the key information and the root of the transformed polynomial are associated with each other.

3. The memory system according to claim 2, wherein the memory controller calculates the key information uniquely determined from a coefficient calculated by using the inverse element among coefficients included in the transformed polynomial.

4. The memory system according to claim 3, wherein the variable transformation is a transformation in which the root of the transformed polynomial is determined for one piece of the key information.

5. The memory system according to claim 2, wherein the memory controller executes, when the key information is represented by $\gamma^3/\beta^5$, the variable transformation represented by Formula (1) and the calculation of the root of the transformed polynomial represented by Formula (2):

[Mathematical Formula 1]

$$x = y + s_1, \ y = \sqrt{\frac{\gamma}{\beta}} z \tag{1}$$

[Mathematical Formula 2]

$$z^3 + z + \sqrt{\frac{\beta^5}{\gamma^3}}. \tag{2}$$

6. The memory system according to claim 2, wherein the memory controller executes, when the key information is represented by $\gamma^3/\beta^5$, the variable transformation represented by Formula (3) and the calculation of the root of the transformed polynomial represented by Formula (4):

[Mathematical Formula 3]

$$x = y + s_1, \ y = \sqrt{\frac{\gamma}{\beta}} (z+1) \tag{3}$$

[Mathematical Formula 4]

$$z^3 + z^2 + \sqrt{\frac{\beta^5}{\gamma^3}}. \tag{4}$$

7. The memory system according to claim 2, wherein the memory controller executes, when the key information is represented by $\beta^5/\gamma^3$, the variable transformation represented by Formula (5) and the calculation of the root of the transformed polynomial represented by Formula (6):

[Mathematical Formula 5]

$$x = y + s_1, \ y = \frac{\beta^2}{\gamma} z \tag{5}$$

[Mathematical Formula 6]

$$z^3 + \frac{\gamma^3}{\beta^5} z + \frac{\gamma^3}{\beta^5}. \tag{6}$$

8. The memory system according to claim 2, wherein the memory controller executes, when the key information is represented by $\beta^5/\gamma^3$, the variable transformation represented by Formula (7) and the calculation of the root of the transformed polynomial represented by Formula (8):

[Mathematical Formula 7]

$$x = y + s_1, \ y = \frac{\beta^2}{\gamma}(z+1) \tag{7}$$

[Mathematical Formula 8]

$$z^3 + z^2 + \left(1 + \frac{\gamma^3}{\beta^5}\right) z + 1. \tag{8}$$

9. The memory system according to claim 2, wherein the memory controller executes, when the key information is represented by $\beta$, the variable transformation represented by Formula (9) and the calculation of the root of the transformed polynomial represented by Formula (10):

[Mathematical Formula 9]

$$x = y + s_1 \tag{9}$$

[Mathematical Formula 10]

$$y^3 + \beta \tag{10}.$$

10. The memory system according to claim 1, wherein the memory controller includes one inverse element calculation circuit that calculates the inverse element in a case where the number of bit errors is 2 or 3.

11. A method of controlling a nonvolatile memory, the method comprising:

storing, in the nonvolatile memory, data encoded with an error correcting code for correcting n-bit errors or less, n being an integer of 3 or more;

reading a received word from the nonvolatile memory;
calculating a syndrome using the read received word;
estimating the number of bit errors using the syndrome;
calculating an inverse element of a value calculated based on the syndrome in a case where the number of bit errors is 2 or 3;
executing, by using the inverse element, variable transformation on a variable of an error locator polynomial corresponding to the number of bit errors and calculation of a root of a transformed polynomial obtained by transforming the error locator polynomial according to the variable transformation;
executing variable inverse transformation on a root of the transformed polynomial to obtain a root of the error locator polynomial; and
correcting an error of an error location corresponding to the root of the error locator polynomial.

12. The method according to claim 11, wherein, when the number of bit errors is 2 or 3, the inverse element is calculated, key information is calculated by at least one of multiplication and power calculation on the inverse element, and the root corresponding to the calculated key information is determined by using correspondence information in which a plurality of values that can be taken by the key information and the root of the transformed polynomial are associated with each other.

13. The method according to claim 12, wherein the key information uniquely determined from a coefficient calculated by using the inverse element among coefficients included in the transformed polynomial is calculated.

14. The method according to claim 13, wherein the variable transformation is a transformation in which the root of the transformed polynomial is determined for one piece of the key information.

15. The method according to claim 12, wherein, when the key information is represented by $\gamma^3/\beta^5$, the variable transformation represented by Formula (1) and the calculation of the root of the transformed polynomial represented by Formula (2) are executed:

[Mathematical Formula 1]

$$x = y + s_1, \quad y = \sqrt{\frac{\gamma}{\beta}} z \qquad (1)$$

[Mathematical Formula 2]

$$z^3 + z + \sqrt{\frac{\beta^5}{\gamma^3}}. \qquad (2)$$

16. The method according to claim 12, wherein, when the key information is represented by $\gamma^3/\beta^5$, the variable transformation represented by Formula (3) and the calculation of the root of the transformed polynomial represented by Formula (4) are executed:

[Mathematical Formula 3]

$$x = y + s_1, \quad y = \sqrt{\frac{\gamma}{\beta}}(z+1) \qquad (3)$$

[Mathematical Formula 4]

$$z^3 + z^2 + \sqrt{\frac{\beta^5}{\gamma^3}}. \qquad (4)$$

17. The method according to claim 12, wherein, when the key information is represented by $\beta^5/\gamma^3$, the variable transformation represented by Formula (5) and the calculation of the root of the transformed polynomial represented by Formula (6) are executed:

[Mathematical Formula 5]

$$x = y + s_1, \quad y = \frac{\beta^2}{\gamma} z \qquad (5)$$

[Mathematical Formula 6]

$$z^3 + \frac{\gamma^3}{\beta^5} z + \frac{\gamma^3}{\beta^5}. \qquad (6)$$

18. The method according to claim 12, wherein, when the key information is represented by $\beta^5/\gamma^3$, the variable transformation represented by Formula (7) and the calculation of the root of the transformed polynomial represented by Formula (8) are executed:

[Mathematical Formula 7]

$$x = y + s_1, \quad y = \frac{\beta^2}{\gamma}(z+1) \qquad (7)$$

[Mathematical Formula 8]

$$z^3 + z^2 + \left(1 + \frac{\gamma^3}{\beta^5}\right)z + 1. \qquad (8)$$

19. The method according to claim 12, wherein, when the key information is represented by $\beta$, the variable transformation represented by Formula (9) and the calculation of the root of the transformed polynomial represented by Formula (10) are executed:

[Mathematical Formula 9]

$$x = y + s_1 \qquad (9)$$

[Mathematical Formula 10]

$$y^3 + \beta \qquad (10).$$

* * * * *